US000001153H

United States Statutory Invention Registration [19]

[11] Reg. Number: H1153

August et al.

[43] Published: Mar. 2, 1993

[54] NON-METALLIZED CHIP CARRIER

[76] Inventors: Melvin C. August, 18416 W. Edgewater Dr., Chippewa Falls, Wis. 54729; Diane M. Christie, E. 3215 Benrude La., Eau Claire, Wis. 54701; Arthur J. Hebert, Rte. 5, Box 385, Eagle Rapid Dr., Chippewa Wis. 54729; Eugene F. Neumann, 19010 E. Edgewater Dr., Chippewa Falls, Wis. 54729; Richard R. Steitz, P.O. Box 253, Chippewa Falls, Wis. 54729

[21] Appl. No.: 646,834

[22] Filed: Jan. 28, 1991

[51] Int. Cl.[5] ..... H01L 23/02

[52] U.S. Cl. ..... 357/74; 357/72

[58] Field of Search ..... 357/72, 74

[56] References Cited

U.S. PATENT DOCUMENTS

| | | | |
|---|---|---|---|
| 4,967,260 | 10/1990 | Butt | 357/70 |
| 5,015,803 | 5/1991 | Mahulikar et al. | 357/74 |

FOREIGN PATENT DOCUMENTS

| | | |
|---|---|---|
| 0370745 | 5/1990 | European Pat. Off. . |
| 52-11767 | 1/1977 | Japan . |
| 52-32267 | 3/1977 | Japan . |
| 63-232342 | 9/1988 | Japan . |
| 1-77953 | 3/1989 | Japan . |

*Primary Examiner*—Bernarr E. Gregory

[57] ABSTRACT

A hermetically sealed carrier for integrated circuits has an IC placed on a carrier substrate, and an electrical lead apparatus, comprised of a highly heat resistant substrate with a metallized interconnect pattern deposited thereon, connected to the IC and brought out across and over the edges of the carrier substrate to facilitate electrical connection to a circuit board. A lid is provided which is placed over the IC. A low-melting temperature adhesive means is then placed on the lid-to-carrier interface and is exposed to heat hermetically sealing the IC. A hermetically sealed carrier including a single silicon die which includes both an active region where an integrated circuit may be fabricated and an inactive region is also provided. Electrical leads are electrically interconnected to the IC of the active region and extend to the periphery of the inactive region of the silicon die. A lid and adhesive means is provided for hermetically sealing the IC of the active region.

1 Claim, 4 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

FIG. 1A
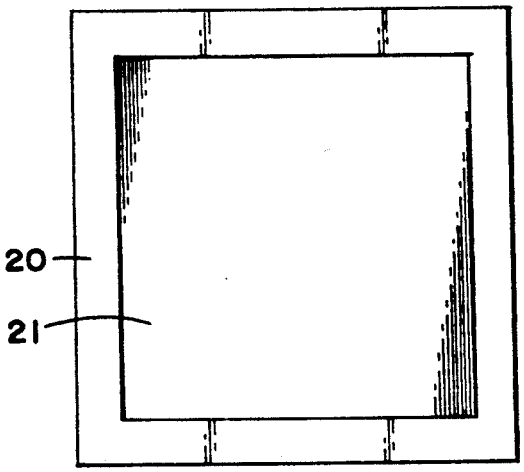
FIG. 2A
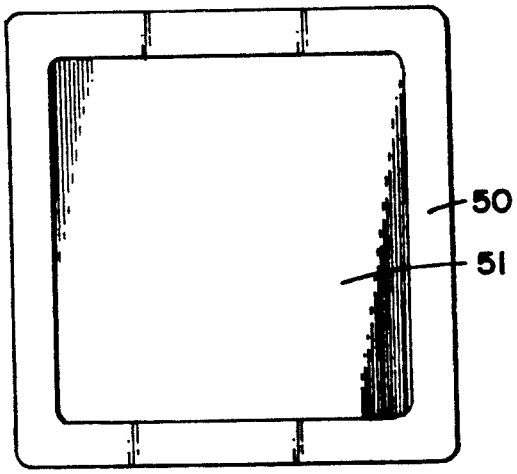
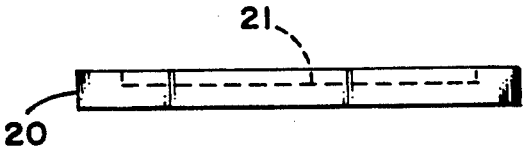
FIG. 1B
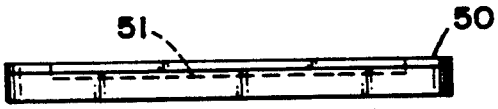
FIG. 2B
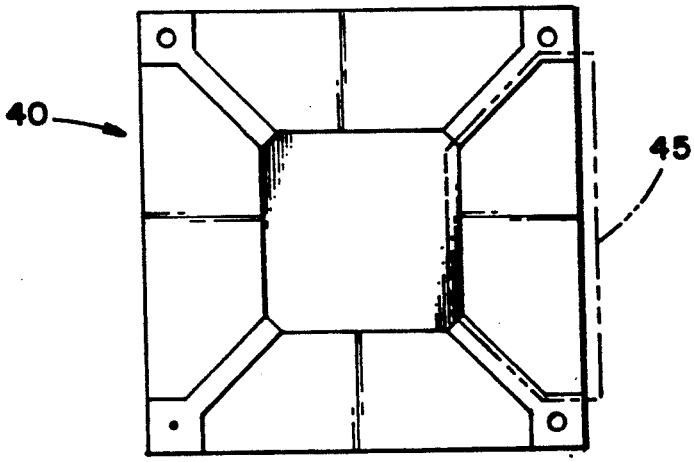
FIG. 3A FIG. 5
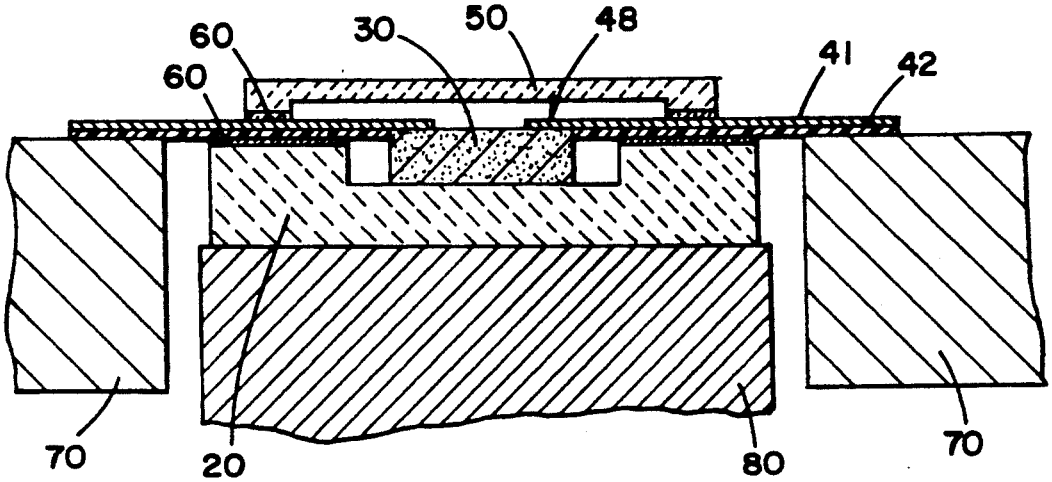
FIG. 6A
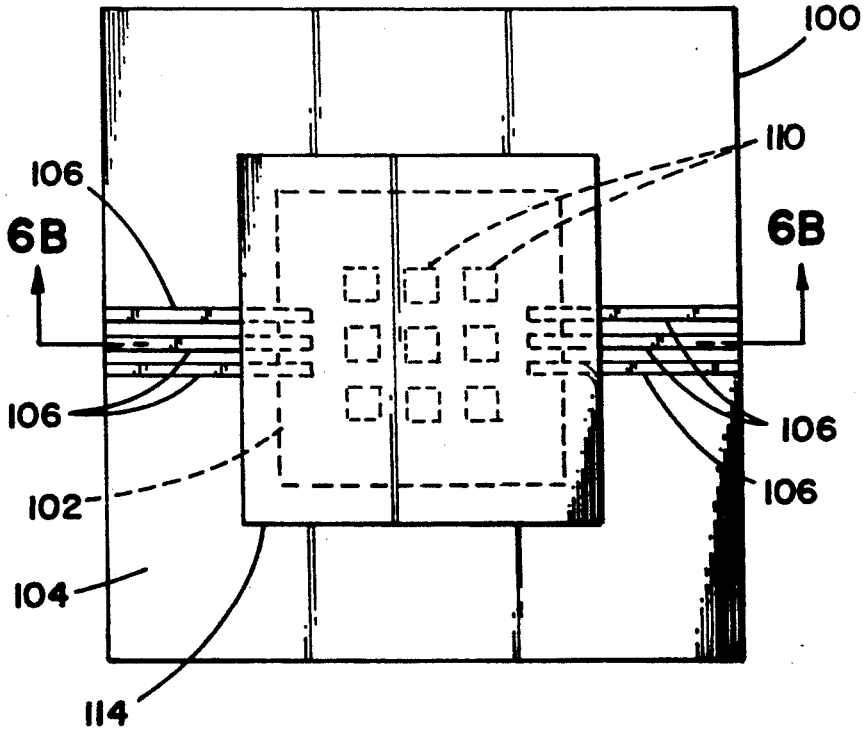
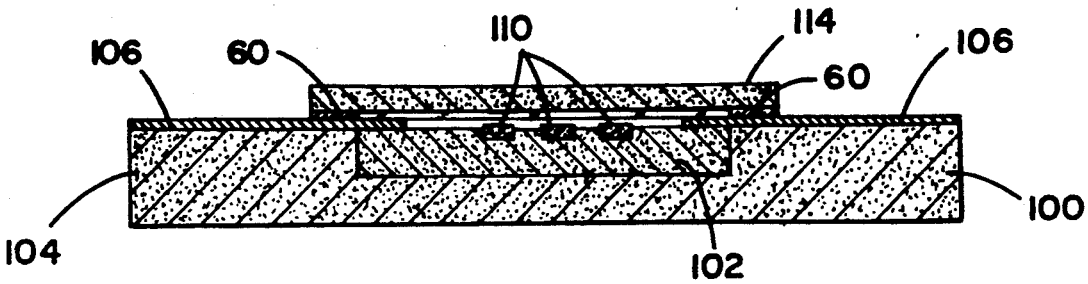
FIG. 6B

NON-METALLIZED CHIP CARRIER

FIELD OF THE INVENTION

This invention relates generally to packaging for high-density integrated circuits (ICs). In particular, it is directed to a hermetically-sealed non-metallized chip carrier.

BACKGROUND OF THE INVENTION

As integrated circuits become more dense, often containing hundreds of I/O connections, existing techniques of packaging, such as using lead frames for the I/O connections, become less suitable. Packaging is considered by many in the industry to be the pacing technology for integrated circuit development. Many designers have recognized the need for developing chip carriers which do not require the deposition of high resolution, metallized traces on the chip carriers, while still allowing the ICs to be hermetically sealed. However, creating such a chip carrier has presented significant manufacturing problems.

In one solution to provide hermetic sealing, chip carriers are fabricated using substrates onto which metallized traces are placed to provide electrical connections from the periphery of the substrate to the integrated circuit packaged within. A lid is then bonded to the substrate and over the metallized traces to provide a hermetic seal. One example of this technique can be found in the co-pending and commonly assigned application filed Apr. 25, 1989, Ser. No. 07/343,506 by Steitz et al. entitled "METALLIZED CERAMIC CHIP CARRIERS", which is incorporated herein by reference. Another example can be found in the co-pending and commonly assigned application filed June 15, 1989, Ser. No. 07/366,604 by Neumann et al. entitled "CHIP CARRIER WITH TERMINATING RESISTIVE ELEMENTS", which is incorporated herein by reference.

In the existing art, it is not possible to connect the IC directly to the circuit board using a direct connection means for hundreds of I/O connections while at the same time allowing hermetic sealing of the IC. The primary shortcomings in the existing art are its expense, due to the high cost of the metallization process, and its reduced reliability, due to the high number of intermediate connections and parts. Thus, there is a need in the art for a chip carrier which does not require the deposition of metallized traces onto the carrier substrate but allows the integrated circuit to be hermetically sealed and directly connected to a circuit board.

SUMMARY OF THE INVENTION

To overcome limitations in the art described above and to overcome other limitations that will become apparent upon reading and understanding the present specification, the present invention provides a chip carrier allowing for direct connection from an IC to a circuit board without the need for depositing metallized traces on the chip carrier, but still allowing the IC to be hermetically sealed. According to a first embodiment of the present invention, an IC is placed onto a carrier substrate. An electrical lead apparatus, is then electrically connected to the IC and brought out along and over the periphery of the substrate to facilitate electrical connection to a circuit board. A carrier lid is positioned over the IC. An adhesive means is placed between the electrical lead apparatus and the carrier substrate and also between the electrical lead apparatus and the carrier lid. Preferably, the adhesive means is a low melting temperature sealing glass. Hermetic sealing is accomplished by exposing the package to high temperatures or to microwave radiation.

According to a second embodiment of the present invention, a single silicon die acts as both the die for the integrated circuit and as the carrier substrate. The single silicon die includes an active region where integrated circuit components are placed and electrically interconnected to form an integrated circuit. The die further includes an inactive region where bonding pads may be placed allowing electrical interconnection from the integrated circuit in the active region to a circuit board. Further, a lid for hermetically sealing the integrated circuit may be bonded by adhesive means to the inactive region of the silicon die. A hermetically sealed prepackaged die is realized, thereby obviating the need to package an integrated circuit chip and simplifying the complicated process of electrically connecting the integrated circuit to a circuit board.

DESCRIPTION OF THE DRAWINGS

In the drawings, where like numerals refer to like elements throughout the several views:

FIGS. 1A and 1B are the top and side views respectively of the carrier substrate used in constructing the non-metallized chip carrier of the present invention;

FIGS. 2A and 2B are the top and side views respectively of the lid for the non-metallized chip carrier of the present invention;

FIG. 3A shows a surface of an electrical lead apparatus comprised of a flexible automated bonding substrate containing a metallized interconnect pattern deposited thereon;

FIG. 5 is a cross-sectional side view of the completed chip carrier of the present invention mounted in a circuit board; and FIGS. 6A and 6B are the top and cross-sectional side views, respectively, of the hermetically sealed prepackaged die of the present invention.

DETAILED DESCRIPTION OF THE PREFERRED EMBODIMENT

Figure 3B:
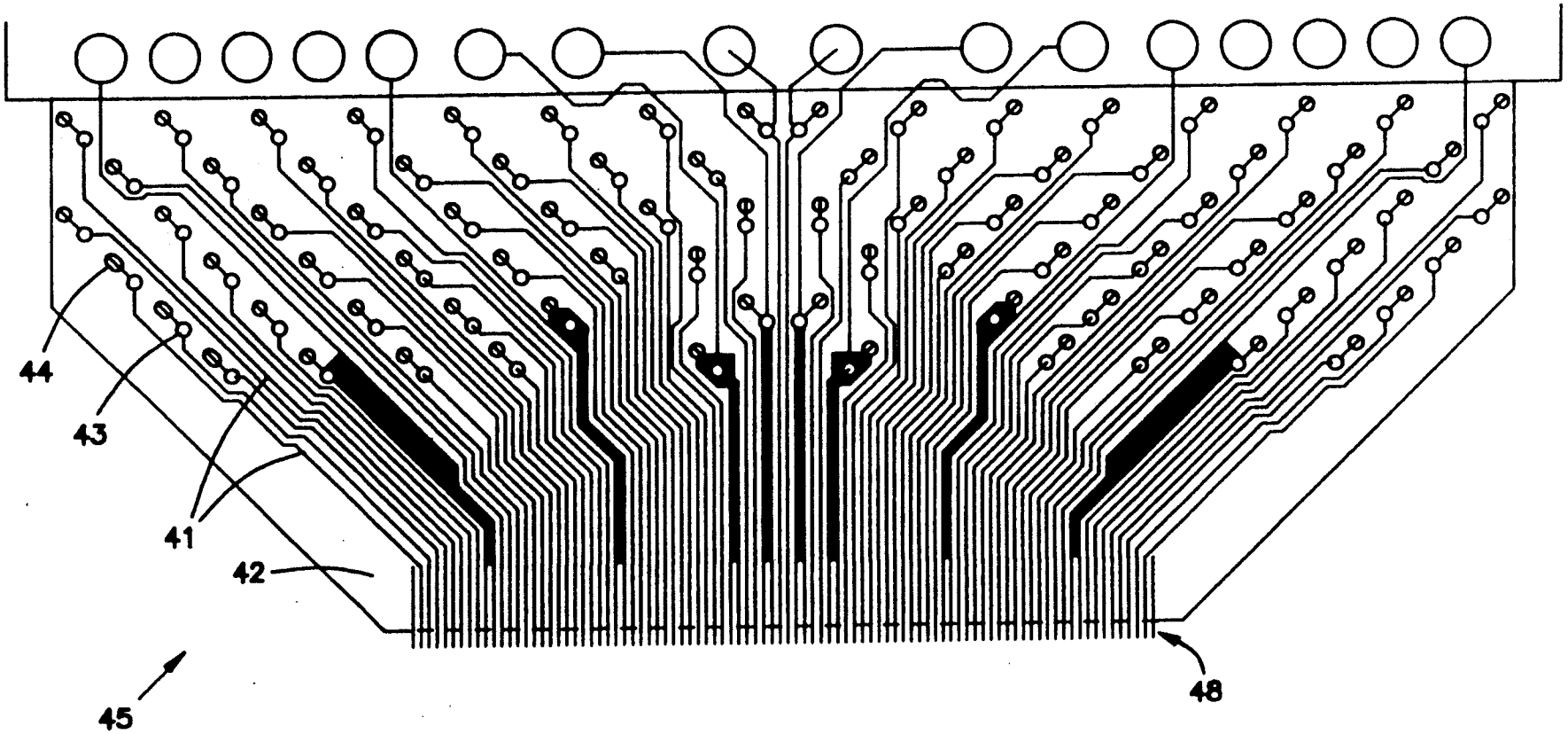
FIG. 3B is an enlargement of the metallized interconnect pattern of FIG. 3A taken along the dashed lines.

In the following Detailed Description of the Preferred Embodiment, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

The present invention describes a non-metallized, hermetically sealed carrier for high density ICs and the steps required to assemble said carrier. The preferred embodiment of the present invention combines the use of a non-metallized chip carrier, an electrical lead apparatus, such as TAB tape constructed with a highly heat resistant substrate, and a low-melting temperature sealing glass to provide for direct connection from an IC to an external circuit board, while allowing the IC to be hermetically sealed by exposing the sealing glass to high temperatures.

FIGS. 1A and 1B are top and side views respectively of a finished carrier substrate 20. In the preferred embodiment, carrier substrate 20 has a cavity 21 for receiving ICs. In the preferred embodiment carrier substrate 20 is fabricated from ceramic using techniques such as that described in the co-pending and commonly assigned applications, U.S. Ser. No. 07/343,506 filed Apr. 25, 1989 to Steitz et al., entitled "METALLIZED CERAMIC CHIP CARRIERS" and U.S. Ser. No. 07/506,729 filed Apr. 9, 1990 to Steitz et al., entitled "METHOD OF FABRICATING METALLIZED CHIP CARRIERS FROM WAFER-SHAPED SUBSTRATES", which applications are incorporated herein by reference. Those skilled in the art will recognize that carrier substrate 20 may be fabricated by other techniques known in the art, and may also be fabricated of silicon, glass, or some other suitable material. Those skilled in the art will also recognize that the carrier substrate 20 may contain multiple cavities for holding multiple ICs, and also that carrier substrate 20 need not contain any cavities, in which case the IC(s) would be surface mounted to carrier substrate 20.

FIGS. 2A and 2B are top and side views respectively of a carrier lid 50 for the chip carrier of the present invention. Carrier lid 50 has a cavity 51 in the preferred embodiment of the present invention, and may be fabricated from ceramic, silicon, glass, or some other suitable material. In the preferred embodiment, lid 50 is sized to cover the cavity 21 of carrier substrate 20. Alternate embodiments may be obtained by combining a carrier substrate having a cavity with a carrier lid having no cavity, or by combining a carrier substrate having no cavity with a carrier lid having a cavity, etc. Those skilled in the art will appreciate that these and other alternate embodiments are calculated to achieve the same purpose as the preferred embodiment described herein, and may be substituted for the specific embodiment shown without departing from the scope of the present invention.

FIG. 3A shows a top view of an integrated circuit electrical lead apparatus 40, having metallized interconnect patterns 45 deposited thereon. In the preferred embodiment, electrical lead apparatus 40 is a form of TAB tape described in the co-pending and commonly assigned application filed Jun. 28, 1990, U.S. Ser. No. 07/545,271, by Steitz et al., entitled "FLEXIBLE AUTOMATED BONDING METHOD AND APPARATUS", which application is incorporated herein by reference.

FIG. 3B is an enlargement of the metallized interconnect pattern 45 of FIG. 3A taken along the dashed lines. In the preferred embodiment of the present invention, electrical lead substrate 42 is comprised of a highly heat resistant polyimide film, such as UPILEX®, available from Ube Industries, Ltd., New York, NY. UPILEX-S plastic film will withstand heating above 500° C with minimal shrinkage or expansion and with minimal damage to electrical traces placed thereon. High temperatures of this degree are required to achieve a hermetic seal with a glass sealing material.

Metallized interconnect pattern 45 contains cantilevered portions 48 of individual metallized traces 41 which extend beyond the edge of TAB substrate 42. These cantilevered portions 48 provide for direct bonding to an IC. Electrical lead apparatus 40 also includes apertures 44 in the electrical lead apparatus substrate 42 across which span individual metallized traces 41 for connection to an external circuit board. Electrical lead apparatus 40 also contains probe pads 43 which can act as maintenance links or as contact points for electrical test apparatus. Probe pads 43 also provide structural strength to individual metallized traces 41.

Figure 4:
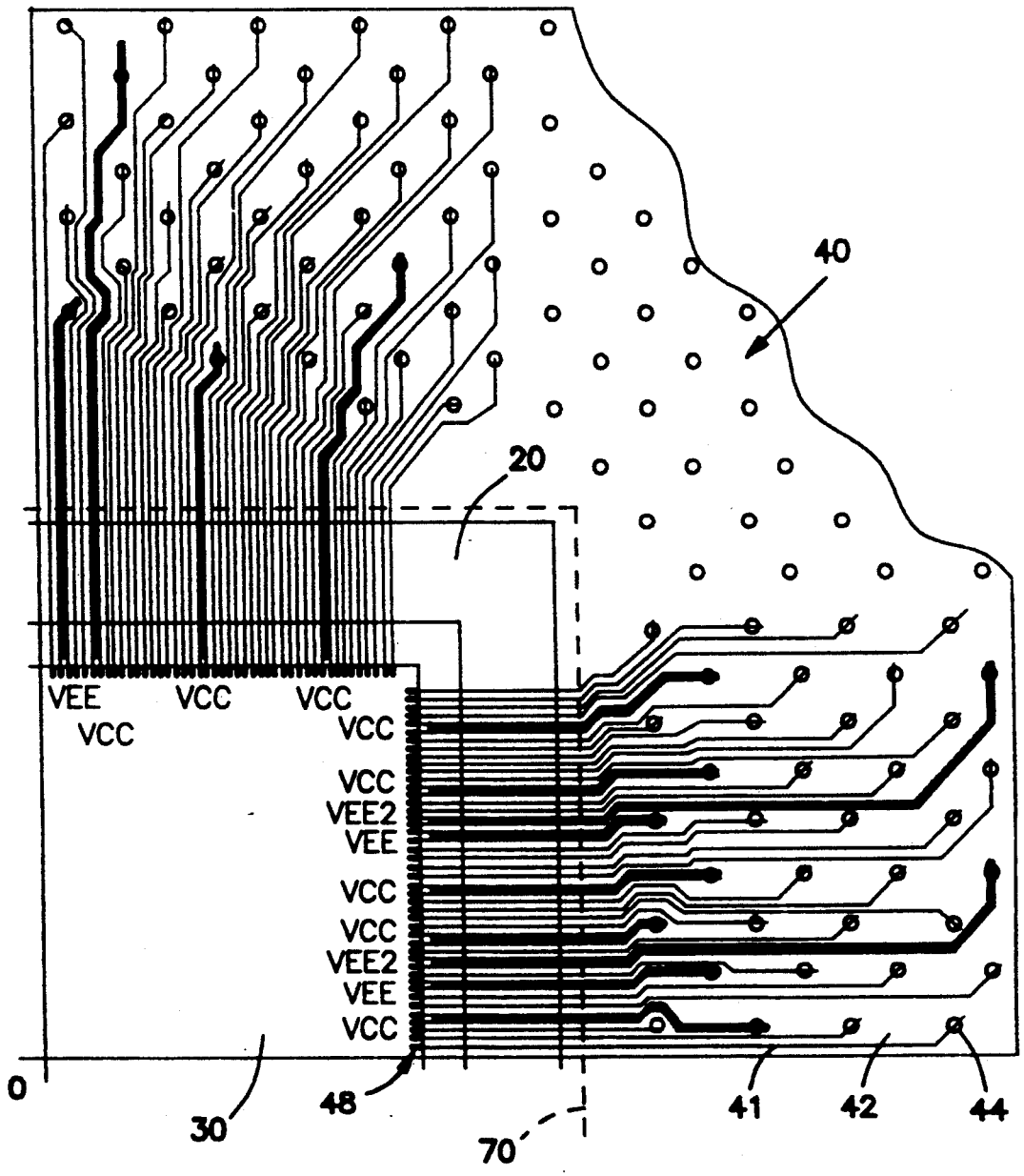
FIG. 4 is a partial top view of the chip carrier of the present invention which shows an IC placed in the carrier substrate having an electrical lead apparatus connected thereto.

FIG. 4 is a partial top view of the carrier of the present invention showing an IC 30 seated on carrier substrate 20 and showing electrical lead apparatus 40 connected thereto. The dashed line indicates the edges of a well or aperture in circuit board 70 which lies beneath TAB substrate 42 and on which the carrier of the present invention is seated. Those skilled in the art will readily recognize that carrier substrate 20 may also be surface mounted to circuit board 70. Circuit board 70 is connected to IC 30 via the metallized interconnects 41 on electrical lead apparatus 40.

Once an IC is placed in the carrier substrate 20 and electrical lead apparatus 40 is properly aligned, cantilevered portions 48 of individual metallized traces 41 are bonded to IC 30. This is done using any one of a variety of standard bonding techniques known in the art, including ultrasonic, thermo-compression, welding, etc. To bond the electrical lead apparatus 40 to the circuit board 70, the downward motion of a bonding tool bends and then bonds the portion of individual metallized traces 41 spanning apertures 44 to traces on the printed circuit board 70 as described in the aforementioned patent application "FLEXIBLE AUTOMATED BONDING METHOD AND APPARATUS". Thus, IC 30 has direct electrical connections to circuit board 70 because the electrical lead apparatus extends across and over the periphery of carrier substrate 20.

FIG. 5 shows a cross-sectional side view of the completed carrier of the present invention mounted in a circuit board 70. IC 30 is placed in the IC receiving recess 21 of carrier substrate 20, and is attached thereto using techniques known in the art. Cantilevered portions 48 of individual metallized traces 41 on electrical lead apparatus 40 are then bonded to IC 30 and are extend across and over the periphery of carrier substrate 20 to facilitate later electrical attachment to circuit board 70.

In the preferred embodiment of the present invention after the electrical lead apparatus 40 is bonded to the IC 30, the hermetic seal is accomplished through the use of a low-melting temperature sealing glass 60, such as one chosen from the following table:

| VENDORS | PRODUCTS | SOFT PT. (C) | SEAL TEMP. (C) | DI-ELECTRIC (MHz) |
|---|---|---|---|---|
| Electroscience | 4029 | — | 415–440 | 12 |
| Labs | 4029-C | — | 415–440 | 12 |
| Ferro | EG-2004 | 334 | 420–450 | 12 |
| Electronic Glasses | EG-2003-1 | 325 | 400–420 | 12 |
| Kyocera | XS-1175M | 375 | 425–440 | 12.2 |
| | XS1175 | 375 | 425–440 | 12.2 |
| | KC400 | 348 | 415–435 | 35.2 |
| | KC402 | 350 | 425–440 | 12.2 |
| NTK Technical | LS-0803 | 350 | 400 | 35 |
| Ceramics | LS-2001 | 400 | 415 | 13.6 |
| Division | LS-2002 | 405 | 430 | 11.5 |
| | SG-350 | 352 | 435 | 11.5 |
| Transene | 500 | 425 | 440–450 | 19 |

The preferred sealing glass 60 would be a sealing glass having a relatively low sealing temperature, such as KC400 in the chart. The low-melting temperature sealing glass 60 bonds carrier lid 50 over the IC 30 and the substrate of the electrical lead apparatus 42 to the carrier substrate 20. Glass is best suited for producing a mechanically reliable tight seal with metals and ceramics because of its viscosity and the good wetting capability of many crystalline materials by the glass. Both vitreous sealing glasses and devitrifying sealing glasses may be used as sealants, Transene 500 is the only devitrifying sealing glass in the above table. To produce a stable and mechanically strong glass seal it is preferable that the thermal contraction of both components of the seal match each other below the setting temperature of the glass because of the mechanical stress limitation in the glass sealant.

The process for hermetic sealing the preferred embodiment of the non-metallized chip carrier would comprise the following operations. First, sealing glass 60 is screen printed on the carrier substrate-to-electrical lead apparatus interface and on the carrier lid-to-electrical lead apparatus interface. Usually only one surface of the two components being sealed is screen printed with the sealing glass 60, however both the mating surfaces may be printed. Drying is performed to remove all volatile solvents. All residual organic constituents will be decomposed by a burn-off step in order to prevent leakage of the final seal. The chip carrier is exposed to temperatures just below the sealing range of the sealing glass to prefuse and sinter, allowing the glass to soften and melting the glass onto the components to be sealed. Last, the mating components which include: the carrier substrate 20, electrical lead apparatus 40, and carrier lid 50, are subjected to a prescribed time temperature heat cycle. The heat cycle is dependent upon the seal thickness, sealing time, sealing glass application technique, and utilization of pressure during the sealing phase. Higher pressures and longer sealing times enable lower sealing temperatures. Lower sealing temperatures in the preferred embodiment are important in order to prevent the electrical lead apparatus from shrinkage or expansion with minimal damage to the electrical traces thereon.

One skilled in the art will readily recognize that several of these steps may be combined, performed separately, and repeated, as may be dictated by the circumstances present. For example, when two mismatched thermal expansion coefficient components are being sealed the process of sealing may include prefusing the glass sealant onto each component separately, and then reflowing the two sealing glass surfaces into each other. This process may even allow the use of more than one type of sealing glass in order to seal the mismatched components.

In another embodiment of the present invention, instead of exposing the non-metallized chip carrier to heat of an oven, the entire package is exposed to an appropriate frequency range of microwave radiation. The frequency range is selected to accomplish a hermetic bond utilizing the sealing glass 60, thus hermetically sealing IC 30 while not affecting the highly heat resistant electrical lead substrate 42 or damaging the individual metallized traces 41 deposited thereon.

Once the carrier is hermetically sealed, it may be placed in a cavity, aperture, or on the surface of a printed circuit board 70. FIG. 5 shows the carrier of the present invention placed in an aperture of circuit board 70 and placed onto a thermal bump 80 which facilitates cooling of the IC components 30. Thermal bump 80 is described in the co-pending and commonly assigned application filed Jan. 16, 1990, Ser. No. 07/464,909, David Morton, entitled "BOARD MOUNTED THERMAL PATH CONNECTOR AND COLD PLATE", which is incorporated herein by reference. The carrier to board connections are made using the portion of electrical lead apparatus 40 extending over the peripheral edge of carrier substrate 20 as described above.

The above mentioned embodiment of the present invention allows for direct connection from an IC to the circuit board without the need for depositing metallized traces on a chip carrier substrate while still allowing the IC to be hermetically sealed. This embodiment allows the IC to be connected with the circuit board with one-half the number of TAB tape connections as was necessary in the prior art.

A second embodiment of the present invention utilizes a single silicon die to achieve a single necessary connection between an IC and a circuit board, eliminating the need for an IC 30 being placed in cavity 21 of chip carrier substrate 20. Rather a single die encompasses both the IC and carrier substrate. Referring to FIG. 6A, a single silicon die 100 includes an active region 102 and an inactive region 104. The active region 102 is an area on the silicon die 100 dedicated for placement of integrated circuit components 110. This active region 102 serves the same purpose as a silicon die of a standard integrated circuit. Integrated circuit components 110 of active region 102 are therefore fabricated using standard integrated circuit technology known in the art. Inactive region 104 serves much the same purpose as a carrier. Inactive region 104 does not need to be doped nor etched as active region 102 requires.

Large bonding pads 106 are electrically interconnected with the integrated circuit components 110 of active region 102. In the prior art, bonding pads were placed on the integrated circuit and electrically interconnected to the carrier substrate by means such as TAB tape. The carrier substrate being metallized is then electrically interconnected to a circuit board. For example, see the previously referenced applications, U.S. Ser. No. 07/343,506 and U.S. Ser. No. 07/366,604. In the embodiment shown in FIGS. 6A and 6B, bonding pads 106 are elongated electrically conductive strips, electrically interconnected to the active region 102 and running across and to the edge of the inactive region 104. While these bonding pads 106 are shown in a particular configuration, those skilled in the art will realize that many configurations of bonding pads 106 will perform the electrical interconnection. The bonding pads 106 extend from active region 102 and past the edge of a lid 114 for electrically connecting the active region 102 and integrated circuit components 110 therein with a circuit board 70.

A lid 114 is bonded over the IC components 110 of the active region 102 to hermetically seal the IC components 110. A sealing glass 60 is placed between the lid 114 and the inactive region 104, the sealing glass 60 being placed over the bonding pads 106 where necessary. The entire package is then hermetically sealed in the same manner as the first embodiment to accomplish a hermetic bond between lid 114, sealing glass 60, and inactive region 104. The lid 114 may either have a cavity as the carrier lid 50 had a cavity 51 in the first embodiment of the invention, although a cavity is not necessary. The clearance between a flat lid 114 and the IC components 110 of the active region 102 will be sufficient solely from the clearance created by the sealing glass 60 placed between the lid 60 and the inactive region 104 of the silicon die 100.

The bonding pads 106 will extend past the outer edge of the lid 114. The IC components 110 may then be electrically connected to a circuit board 70 (not shown in FIG. 6) by means such as TAB tape or wire bonding connected to the bonding pads 106 and the circuit board 70. The bonding pads 106 on the single silicon die 100 allow a single connection over the circuit board well between the bonding pads 106 and the circuit board 70 thereby eliminating the additional connection needed in the prior art between the bonding pad of an integrated circuit chip and a metallized trace on a chip carrier over the chip carrier well.

The pre-packaged die embodiment of the invention offers further advantages over the prior art. Since the integrated circuit is fabricated in the active region of the single silicon die, no assembly is required as opposed to the prior art assembly of placing the IC chip into the chip carrier. Because this assembly step is eliminated, the need to electrically interconnect the bonding pads of the IC chip with the metallized traces of chip carrier is eliminated. Further, the large bonding pads of the prepackaged die embodiment eliminates the concern of the durability of the TAB tape during the high temperature hermetic sealing step, because these large bonding pads extend beyond the lid-inactive region interface. Also, for this reason the need for a low-melting temperature sealing glass is eliminated.

Although a specific embodiment has been illustrated and described herein, it will be appreciated by those skilled in the art that any arrangement which is calculated to achieve the same purpose may be substituted for the specific embodiment shown. For example the carrier substrate of the first embodiment of the present invention disclosed herein may be implemented with different materials, such as silicon, ceramic, or glass. In addition, different processing steps, different electrical lead apparatus substrates, different sealing glasses, and different hermetic sealing methods than those disclosed in the Detailed Description could be used. This application is intended to cover any adaptations or variations of the present invention. Therefore, it is manifestly intended that this invention be limited only by the claims and the equivalents thereof.

What is claimed is:

1. A hermetically sealed carrier for an integrated circuit, comprising:

a ceramic carrier substrate having a cavity for holding the integrated circuit and having a periphery; an electrical lead TAB tape having electrical traces formed on a polyamide film for electrically connecting the integrated circuit to a circuit board, said electrical lead TAB tape extending across and over said periphery of said ceramic carrier substrate forming extended portions, said extended portions providing for electrical attachment of the integrated circuit to said circuit board;

a ceramic carrier lid positioned over said integrated circuit; and sealing glass between said electrical lead TAB tape and said carrier substrate and between said electrical lead TAB tape and said carrier lid for forming a hermetic seal over the integrated circuit.

* * * * *